United States Patent
Ge et al.

(10) Patent No.: US 11,283,018 B2
(45) Date of Patent: Mar. 22, 2022

(54) RRAM-BASED CROSSBAR ARRAY CIRCUITS WITH INCREASED TEMPERATURE STABILITY FOR ANALOG COMPUTING

(71) Applicant: TETRAMEM INC., Newark, CA (US)

(72) Inventors: Ning Ge, Newark, CA (US); Minxian Zhang, Newark, CA (US)

(73) Assignee: TETRAMEM INC., Newark, CA (US)

( * ) Notice: Subject to any disclaimer, the term of this patent is extended or adjusted under 35 U.S.C. 154(b) by 0 days.

(21) Appl. No.: 16/367,184

(22) Filed: Mar. 27, 2019

(65) Prior Publication Data

US 2020/0313087 A1 Oct. 1, 2020

(51) Int. Cl.
*H01L 27/24* (2006.01)
*H01L 45/00* (2006.01)

(52) U.S. Cl.
CPC ........ *H01L 45/146* (2013.01); *H01L 27/2436* (2013.01); *H01L 27/2463* (2013.01); *H01L 45/08* (2013.01); *H01L 45/1253* (2013.01); *H01L 45/147* (2013.01)

(58) Field of Classification Search
CPC . H01L 27/2436; H01L 27/2463; H01L 45/08; H01L 45/1253; H01L 45/147
See application file for complete search history.

(56) References Cited

U.S. PATENT DOCUMENTS

| 2014/0091272 | A1* | 4/2014 | Liao | H01L 27/2436 257/4 |
| 2017/0271583 | A1* | 9/2017 | Majhi | H01L 45/146 |
| 2018/0366591 | A1* | 12/2018 | Song | H01L 45/1266 |

* cited by examiner

*Primary Examiner* — Trang Q Tran
(74) *Attorney, Agent, or Firm* — MagStone Law LLP (57) ABSTRACT

Technologies relating to RRAM-based crossbar array circuits with increase temperature stability are disclosed. An example apparatus includes: a bottom electrode; a filament forming layer formed on the bottom electrode; and a top electrode formed on the filament forming layer, wherein the filament forming layer is configured to form a filament within the filament forming layer when applying a switching voltage upon the filament forming layer, and wherein a material of the filament includes nitrogen-doped $Ta_2O_5$, $Ta_2N/Ta_2O_5$, or $TaN_yO_z$.

7 Claims, 6 Drawing Sheets

| Material | Resistivity mΩ·m | Resistivity Ratio, $Ta_2N/Ta$ |
|---|---|---|
| Ta | 0.13 | |
| $Ta_2N$ (PVD) | 2 | 15 |

| Material | TCR, ppm/ °C |
|----------|--------------|
| Ta | +3,000 |
| Ta$_2$N | ±25 |
| TaN | -130 |

| Element | Atomic Number | Atomic Radius, pm | Anion size, pm | Activation barrier |
|---------|---------------|-------------------|----------------|--------------------|
| N | 7 | 65 | 132 ($N^{3-}$) | $E_N > E_O$ |
| O | 8 | 60 | 126 ($O^{2-}$) | |

FIG. 6

RRAM-BASED CROSSBAR ARRAY CIRCUITS WITH INCREASED TEMPERATURE STABILITY FOR ANALOG COMPUTING

TECHNICAL FIELD

The present disclosure generally related to crossbar array circuits with Resistive Random-Access Memory (RRAM) and more specifically to RRAM-based crossbar array circuits with improved temperature stability for analog computing.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a FIRS to a LRS is often referred to as a "Set" or "On" switch; the switching systems from a LRS to a FIRS is often referred to as a "Reset" or "Off" switching process.

The Temperature Coefficient of Resistance (also referred to as TCR) is one of the characterizing parameters for a resistor. TCR defines the change in resistance as a function of the ambient temperature. A common way to express the TCR is by ppm/° C., which stands for parts per million per centigrade degree. A positive TCR refers to materials that experience an increase in electrical resistance when their temperature is raised. The higher the TCR, the greater an increase in electrical resistance for a given temperature increase. Most metals have positive TCR. In contrast, a negative TCR refers to materials that experience a decrease in electrical resistance when their temperature is raised. The more negative the TCR, the greater s decrease in electrical resistance for a given temperature increase. Semiconductors and insulator materials have negative TCR.

SUMMARY

The technology of an RRAM-based crossbar array circuit with improved temperature stability is disclosed.

In some implementations, an apparatus includes: a bottom electrode; a filament forming layer formed on the bottom electrode; and a top electrode formed on the filament forming layer, wherein the filament forming layer is configured to form a filament within the filament forming layer when applying a switching voltage upon the filament forming layer, and wherein a material of the filament includes nitrogen-doped or N-doped $Ta_2O_5$, $Ta_2N/Ta_2O_5$, or $TaN_yO_z$.

In some implementations, a material of the bottom electrode or the top electrode includes Pt, Ti, TiN, Pd, Ir, W, Ta, Hf, Nb, V, Ru, TaN, NbN, or any combination or alloy of other electrically conductive materials thereof.

In some implementations, the apparatus further includes: a bottom wire; and a top wire, wherein the bottom electrode is formed on the bottom wire, and the top wire is formed on the top electrode.

In some implementations, a material of the bottom wire or the top wire includes Al, Au, Cu, Fe, Ni, Mo, Pt, Pb, Ti, TiN, Sn, W, Zn, or any combination or alloy of other electrically conductive materials thereof.

In some implementations, a material of the filament forming layer includes $TaO_x$ (where x≤2.5), $HfO_x$ (where x≤2.0), $TiO_x$ (where x≤2.0), $ZrO_x$ (where x≤2.0), or the combination thereof.

In some implementations, a material of the filament includes Ta-rich, Hf-rich, or Ti-rich oxide material.

In some implementations, the apparatus further includes a passivation layer isolated the filament forming layer, the bottom electrode, and the top electrode, from the bottom wire and the top wire, wherein a material of the passivation layer includes $Al_2O_3$, $SiO_2$, SiN, AlN, MgO, $TiO_2$, AlOxNy, SiOxNy or the combination thereof.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to RRAM-based crossbar array circuits with increase temperature stability are disclosed. The technologies described in the present disclosure may provide the following technical advantages.

First, the disclosed technologies enable analog switching RRAM-based crossbar array circuits to have low conductance (or high resistance) RRAM cells during an LRS operation. This results in low operation current and thus low operation power. It is especially advantageous when applied to large-scaled cross bar array for neuromorphic computing (e.g., in forward inference) which usually has higher power consumption.

Second, designs of RRAM filaments described in the present disclosure provide better temperature stability, a desirable technical characteristic relating to RRAM resistance.

Third, the selection of the material in the present disclosure is designed not to impede the filament's original switching mechanism, stays in equilibrium with other materials in the RRAM, while maintains the advantages mentioned above.

Figure 1A:
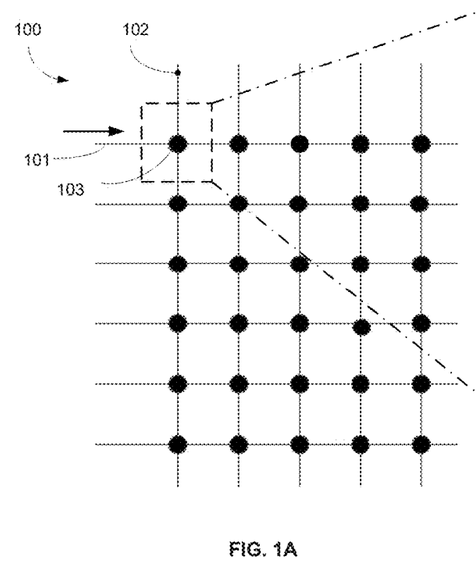
FIG. 1A is a block diagrams illustrating an example crossbar array circuit in accordance with some implementations of the present disclosure.

FIG. 1A is a block diagram illustrating an example crossbar array circuit 100 in accordance with some implementations of the present disclosure. As shown in FIG. 1A, the crossbar array circuit 100 includes a first row wire 101, a first column wire 102, and a cross-point device 103.

Figure 1B:
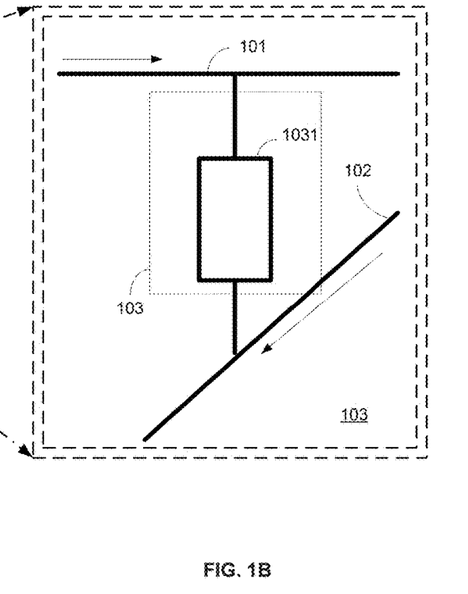
FIG. 1B is a block diagrams illustrating an example cross-point device in accordance with some implementations of the present disclosure.

FIG. 1B is a block diagram illustrating a partially enlarged view of the example cross-point device 103 in accordance with some implementations. As shown FIG. 1B, the cross-point device 103 connects the first row wire 101 and the first column wire 102 of the crossbar array circuit 100. The cross-point device 103 includes a 1S1R stack 1031. In some implementations, the cross-point device 103 includes a RRAM cell 1031. In some implementations, the RRAM cell 1031 is one of: a one-transistor-one-memristor (1T1R) stack, one-selector-one-memristor (1S1R), or a memristor (RRAM) stack.

Figure 2:
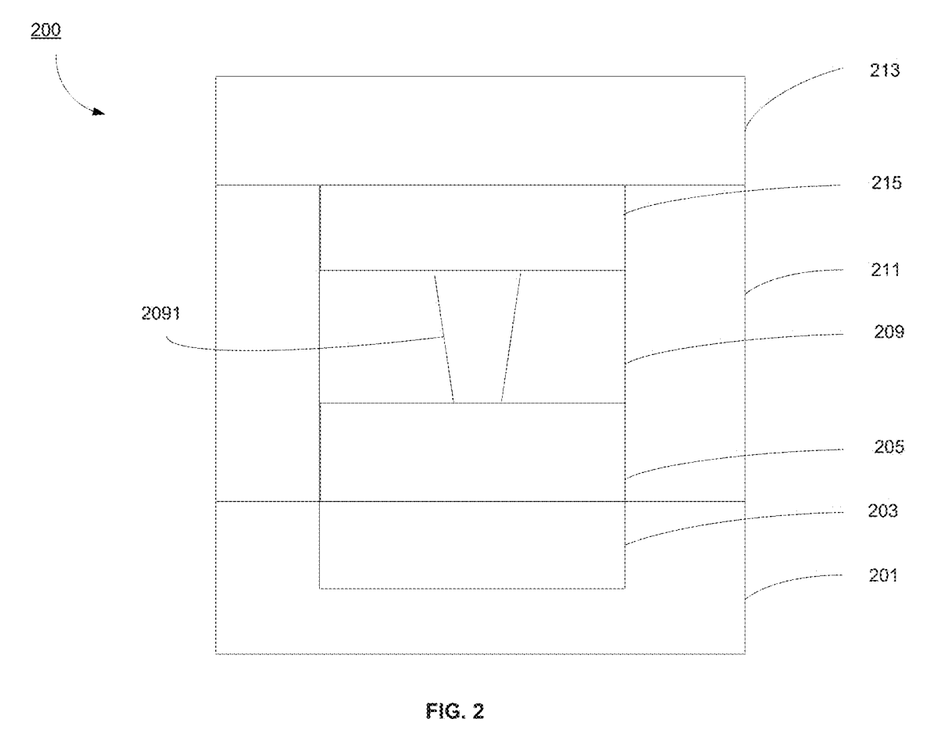
FIG. 2 is a block diagram illustrating an example RRAM cell in accordance with some implementations of the present disclosure.

FIG. 2 is a block diagram illustrating an example RRAM cell 200 in accordance with some implementations of the present disclosure.

In some implementations, the RRAM cell 200 includes a substrate 201, a column wire (e.g., a bottom wire) 203 formed on the substrate 201, a bottom electrode 205 formed on column wire 203, a filament forming layer 209 formed on the bottom electrode 205, a top electrode 215 formed on the filament forming layer 209, a row wire (e.g., a top wire) 213 formed on the top electrode 215, and a passivation layer 211 isolating the filament forming layer 209, the bottom electrode 205, and the top electrode 215, from the column wire 203 and the row wire 213.

In some implementations, the substrate 201 is made of one of the following materials: Si, SiN, $SiO_2$, $Al_2O_3$, or a combination thereof; the passivation layer 211 is made of one of the following materials: $Al_2O_3$, $SiO_2$, SiN, AlN, MgO, $TiO_2$, AlOxNy, SiOxNy or a combination thereof.

The column wire 203 is, in some implementations, made of one of the following materials: Al, Au, Cu, Fe, Ni, Mo, Pt, Pb, Ti, TiN, Sn, W, Zn, a combination thereof, or an alloy thereof; the row wire 213 is also made of one of the following materials: Al, Au, Cu, Fe, Ni, Mo, Pt, Pb, Ti, TiN, Sn, W, Zn, a combination thereof, or an alloy thereof.

The bottom electrode 205 is, in some implementations, made of one of the following materials: Pt, Ti, TiN, Pd, Ir, W, Ta, Hf, Nb, V, Ru, TaN, NbN, a combination thereof, or an alloy thereof; the top electrode 215 is also made of one of the following materials: Pt, Ti, TiN, Pd, Ir, W, Ta, Hf, Nb, V, Ru, TaN, NbN, a combination thereof, or an alloy thereof. In some implementations, the bottom electrode 205, the top electrode 215, or both are configured to provide better ohmic contact.

The filament forming layer 209 is, in some implementations, made of one of the following materials: $TaO_x$ (where $x \leq 2.5$), HfOx (where $x \leq 2.0$), $TiO_x$ (where $x \leq 2.0$), $ZrO_x$ (where $x \leq 2.0$), or a combination thereof. The filament forming layer 209 may form a filament 2091 within the filament forming layer 209, in response to a set voltage or current being applied to the RRAM cell 200.

The filament 2091, in some implementations, includes an oxygen vacancy filament. The filament 2091 may include N-doped Ta-rich, N-doped Hf-rich, N-doped Ti-rich, N-doped Zr-rich oxide material. More specifically, the filament 2091, in some implementations, includes N-doped $TaO_x$ (including N-doped $TaO_2$ and N-doped $Ta_2O_5$), $Ta_2N/Ta_2O_5$, or $TaN_yO_z$. The N-doped $TaO_x$ (which may include N-doped $TaO_2$ and N-doped $Ta_2O_5$), $Ta_2N/Ta_2O_5$, or $TaN_yO_z$ may be formed by reactive sputtering.

The designs of the N-doped filament as described in the present disclosure provide at least the following technical advantages.

First, responsive to a set voltage being applied to a RRAM cell, a filament is formed within the RRAM cell and the resistance of the RRAM cell is set to LRS. For instance, in a $TaO_x$-based RRAM cell, a filament (a Ta-rich oxide) is formed within the cell, in response to a determination that a set voltage has been applied to the cell.

The conductivity and oxygen vacancy mobility of the RRAM filament are temperature dependent. For instance, the filament in RRAM oxides exhibits generally metallic behavior, where the TCR>0. As in the $TaO_x$-based RRAM example, the TCR value of Ta is higher than 3000 ppm/° C. A high TCR value (whether positive or negative) like this may affect RRAM resistance's temperature stability, reduce the resistance's stability, and therefore cause computing inaccuracy. Therefore, if a filament's TCR (absolute) value is low, then the variation in filament conductivity and oxygen mobility at the switching temperature are more stable. Having less variation in filament conductivity reduces computational error and increases computing accuracy.

Various designs of analog RRAM with improved filamentary LRS resistivity for low current analog RRAM operation and with improved resistance stability are described. Because (1) $Ta_2N$ is in equilibrium with $TaO_x$, Ta, and TaN; (2) $Ta_2N$ has 15 times higher resistivity than that of Ta; (3) $Ta_2N$ has near zero TCR (which indicates excellent temperature stability on RRAM resistance); and (4) oxygen anion is more mobile than nitrogen anion (which indicates oxygen anion is the major migration species during N-doped RRAM switching), a nitrogen doped filament RRAM cell may be technically advantageous.

The N-doped filament's phase equilibrium with other elements/materials of filament, the LRS resistance of the N-doped filament, the temperature stability of the N-doped filament, and the mobility between the oxygen anion and the nitrogen anion are discussed below.

Phase Equilibrium Considerations

Figure 3:
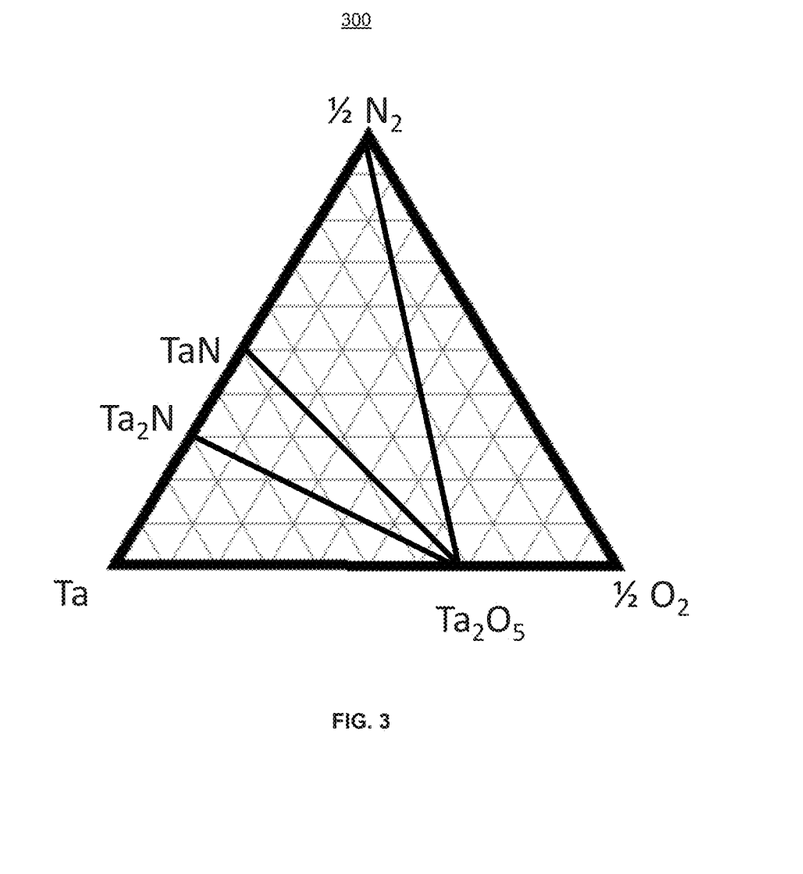
FIG. 3 shows a Ta—O—N equilibrium phase diagram illustrating example stable phases of a combination of Ta, O, and N.

In accordance with Ta—O and Ta—N binary phases, the Ta—O binary includes two stable solid phases: Ta and $Ta_2O_5$; and the Ta—N binary includes three stable solid phases: Ta, $Ta_2N$, and TaN. The estimated isotherm of Ta—O—N illustrated in FIG. 3 shows that $Ta_2O_5$ is in equilibrium with all other phases; $Ta_2N$ is in equilibrium with Ta, $Ta_2O_5$, and TaN. N-doped filament such as N-doped $TaO_x$ (including N-doped $TaO_2$ and N-doped $Ta_2O_5$), $Ta_2N$, or $TaN_yO_z$ may therefore be in equilibrium with $TaO_x$ of the RRAM oxide.

LRS Resistance

Figure 4:
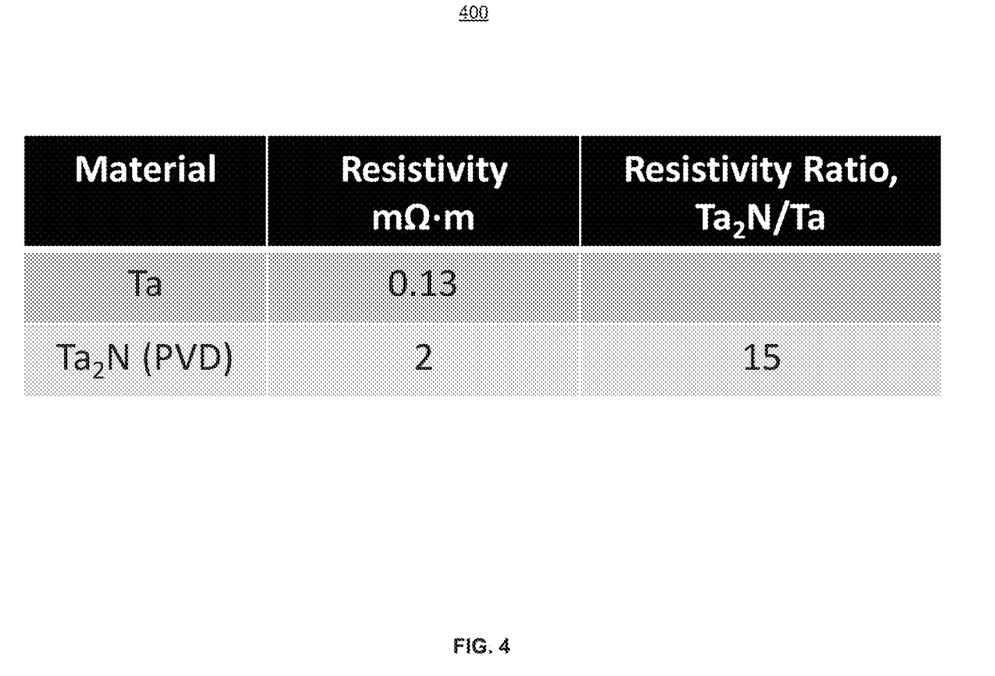
FIG. 4 is a table illustrating example relative resistivity of Ta and $Ta_2N$.

FIG. 3 shows a Ta—O—N equilibrium phase diagram illustrating example stable phases of a combination of Ta, O, and N. FIG. 4 is a table 400 illustrating example relative resistivity of Ta and $Ta_2N$.

As shown in FIG. 4, Ta has a resistivity of 0.13 mΩ·m; $Ta_2N$ has a resistivity of 2 mΩ·m. The resistivity ratio between $Ta_2N$ and Ta is more than 15. This suggests that N-doped $TaO_x$, $Ta_2N$, or $TaN_yO_z$ may have 10 times or better resistivity at LRS than does $TaO_x$. An N-doped filament may, therefore, reduce analog RRAM operation current.

Temperature Stability

Figure 5:
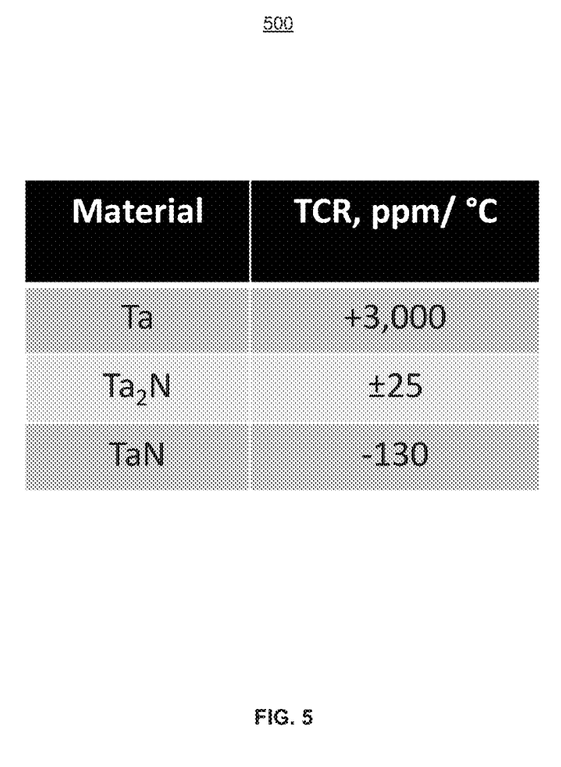
FIG. 5 is a table illustrating example TCR value of Ta, $Ta_2N$, and TaN.

FIG. 5 is a table 500 illustrating example TCR value of Ta, $Ta_2N$, and TaN. As shown in FIG. 5, the TCR of Ta is as high as +3000 ppm/° C. (a metallic behavior); the TCR of TaN is approximately −130 ppm/° C. (a semiconductor behavior); and the TCR of $Ta_2N$ is as low as ±25 ppm/° C., which may be closer to zero with an appropriate annealing process. The near zero TCR of $Ta_2N$ is therefore desirable for ensuring an RRAM's resistance remains stable despite temperature variations.

Oxygen Anion Mobility Vs. Nitrogen Anion Mobility

Because the switching mechanism of an RRAM depends on oxygen vacancy migration, it is important noted that the N-doped $TaO_x$ does not alter the switching mechanism.

Figure 6:
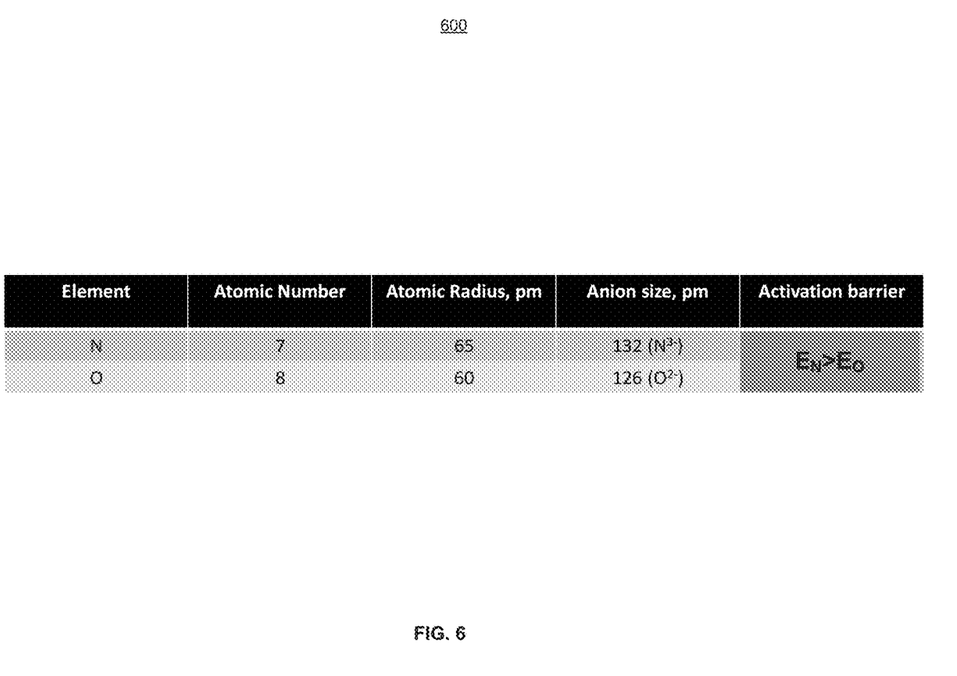
FIG. 6 a table illustrating an example mobility comparison between nitrogen and oxygen.

FIG. 6 is a table 600 illustrating an example mobility comparison between nitrogen and oxygen. As shown in FIG. 6, although the atomic number of O is higher than that of N, the atomic radius of N is larger than that of O, and the anion size of $N^{3-}$ is larger than that of $O^{2-}$. Further, the activation energy barrier for nitrogen anion migration, $E_N$, is higher than the activation energy barrier for oxygen anion migration, $E_O$. The comparison result shown in FIG. 6 indicates that nitrogen anion is less mobile than oxygen anion. Therefore, because the oxygen anion still is the dominant migration ion, the switching mechanism of an RRAM remains the same or at least not significantly changed.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
   a bottom electrode;
   a filament forming layer formed on the bottom electrode; and
   a top electrode formed on the filament forming layer, wherein a filament is formed within the filament forming layer responsive to a switching voltage applied to the filament forming layer, and wherein the filament comprises at least one of N-doped $Ta_2O_5$, N-doped $TaO_2$, $Ta_2N/Ta_2O_5$, or $TaN_yO_z$, wherein y and z are respective values determined by a state of oxidation of N, and wherein y>0 and z>0.

2. The apparatus as claimed in claim 1, wherein at least one of the bottom electrode or the top electrode comprises Pt, Ti, TiN, Pd, Ir, W, Ta, HfNb, V, Ru, TaN, NbN, or any combination or alloy of other electrically conductive materials thereof.

3. The apparatus as claimed in claim 1, further comprises
   a bottom wire; and
   a top wire, wherein the bottom electrode is formed on the bottom wire, and wherein the top wire is formed on the top electrode.

4. The apparatus as claimed in claim 3, wherein the bottom wire or the top wire comprises at least one of Al, Au, Cu, Fe, Ni, Mo, Pt, Pb, Ti, TiN, Sn, W, or Zn.

5. The apparatus as claimed in claim 1, wherein the filament forming layer comprises at least one of $TaO_x$ (where x<2.5), $HfO_x$ (where x<2.0), $TiO_x$ (where x<2.0), or $ZrO_x$ (where x<2.0).

6. The apparatus as claimed in claim 5, wherein the filament further comprises at least one of a Ta— rich oxide material, a Hf-rich oxide material, a Ti-rich oxide material, or a Zr-rich oxide material.

7. The apparatus as claimed in claim 3, further comprising a passivation layer isolating the filament forming layer, the bottom electrode, and the top electrode, from the bottom wire and the top wire, wherein the passivation layer comprises at least one of $Al_2O_3$, $SiO_2$, SiN, AlN, MgO, $TiO_2$, $AlO_xN_y$, or $SiO_xN_y$, wherein x and y are respective values determined by the state of oxidation of N, and wherein $x>0$ and $y>0$.

\* \* \* \* \*